United States Patent
Pangal et al.

(10) Patent No.: US 9,231,202 B2
(45) Date of Patent: Jan. 5, 2016

(54) THERMAL-DISTURB MITIGATION IN DUAL-DECK CROSS-POINT MEMORIES

(71) Applicant: Intel Corporation, Santa Clara, CA (US)

(72) Inventors: Kiran Pangal, Fremont, CA (US); Max F. Hineman, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/921,672

(22) Filed: Jun. 19, 2013

(65) Prior Publication Data

US 2014/0374686 A1 Dec. 25, 2014

(51) Int. Cl.
*H01L 45/00* (2006.01)
*H01L 27/24* (2006.01)

(52) U.S. Cl.
CPC ........ *H01L 45/1293* (2013.01); *H01L 27/2481* (2013.01); *H01L 45/06* (2013.01); *H01L 45/1233* (2013.01); *H01L 45/144* (2013.01); *H01L 45/16* (2013.01)

(58) Field of Classification Search
CPC . H01L 45/1233; H01L 45/06; H01L 27/2463; H01L 45/144; H01L 45/122; H01L 45/128
USPC ...................... 257/2, 4, 5, E27.004, E21.068; 438/102, 103, 95
See application file for complete search history.

(56) References Cited

U.S. PATENT DOCUMENTS

| | | | | |
|---|---|---|---|---|
| 7,291,878 B2 * | 11/2007 | Stipe | ............................. | 257/296 |
| 7,394,088 B2 * | 7/2008 | Lung | ................................. | 257/2 |
| 7,714,315 B2 * | 5/2010 | Happ et al. | ....................... | 257/5 |
| 8,471,297 B2 * | 6/2013 | Murata | .......................... | 257/211 |
| 8,530,874 B1 * | 9/2013 | Varesi | ................................. | 257/2 |
| 8,648,471 B2 * | 2/2014 | Tabata et al. | .................. | 257/774 |
| 2005/0201182 A1 * | 9/2005 | Osada et al. | ............. | 365/230.03 |
| 2007/0181932 A1 * | 8/2007 | Happ et al. | .................... | 257/314 |
| 2009/0027938 A1 * | 1/2009 | Wells | ............................. | 365/51 |
| 2010/0019215 A1 * | 1/2010 | Lung et al. | ......................... | 257/2 |
| 2010/0187591 A1 * | 7/2010 | Nagashima | ................... | 257/314 |
| 2011/0306199 A1 * | 12/2011 | Nojiri et al. | ................... | 438/618 |
| 2012/0199807 A1 * | 8/2012 | Goswami | .......................... | 257/9 |
| 2012/0205612 A1 * | 8/2012 | Tabata et al. | ...................... | 257/5 |
| 2013/0258740 A1 * | 10/2013 | Zhang | ............................. | 365/51 |
| 2014/0158969 A1 * | 6/2014 | Wells | ................................. | 257/4 |

* cited by examiner

*Primary Examiner* — Marvin Payen
*Assistant Examiner* — Victor Barzykin
(74) *Attorney, Agent, or Firm* — Alpine Technology Law Group LLC (57) ABSTRACT

A thermal isolation layer is formed between the bit line (BL) layers or word line (WL) layers of the decks of a multi-deck phase-change cross-point memory to mitigate thermal problem disturb of memory cells that tends to increase as memory sizes are scaled smaller. Embodiments of the subject matter disclosed herein are suitable for, but are not limited to, solid-state memory arrays and solid-state drives.

24 Claims, 6 Drawing Sheets

THERMAL-DISTURB MITIGATION IN DUAL-DECK CROSS-POINT MEMORIES

TECHNICAL FIELD

Embodiments of systems and techniques described herein relate to memory devices. More particularly, embodiments of systems and techniques described herein relate to a thermal isolation layer between the bit line (BL) layers of the decks of a dual-deck phase-change cross-point memory.

BACKGROUND

Phase-change memory devices, such as memory devices utilizing a chalcogenide material, electrically heat the phase-change materials to a high temperature to induce material phase transitions. Changing the phase of a phase-change material involves applying a high-current bias that flows through a target memory cell and joule heating induces a phase-change transition, both from a crystalline state to an amorphous state (i.e., a higher temperature for shorter duration) and from an amorphous state to a crystalline state (i.e., a lower temperature, but longer duration to induce crystal growth). The heat generated in the target cell during a phase-change operation dissipates primarily through the metal bit lines and/or word lines coupled to the target cell, which causes an increase in the temperature of the surrounding cells. The thermally conducted heat can result in a thermal disturb in the neighboring cells. That is, the thermally conducted head can cause either retention loss for a neighboring cell in a RESET state or accelerated drift leading to a higher threshold voltage $V_T$ for a neighboring cell in a SET state.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments described herein relate to systems and techniques that provide a thermal isolation layer between the bit line (BL) layers of the decks of a dual-deck phase-change cross-point memory. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Embodiments of the subject matter disclosed herein relate to systems and methods that provide a thermal isolation layer between the bit line (BL) layers of the decks of a dual-deck phase-change cross-point memory. Additionally, embodiments of the subject matter disclosed herein can be, but are not limited to, part of a solid-state memory array or a solid-state drive.

As the distance between neighbor cells is decreased as phase-change cross-point memory devices are scaled smaller, the temperature rise experienced by a neighbor cell (referred to herein as a victim cell) increases as a target cell (referred to herein as an aggressor cell) is written (i.e., either RESET or SET). Retention mechanisms, such as crystallization of the amorphous state and drift leading to increased resistance, are accelerated by an increase in temperature, causing increased bit errors on a victim cell.

Figure 1:
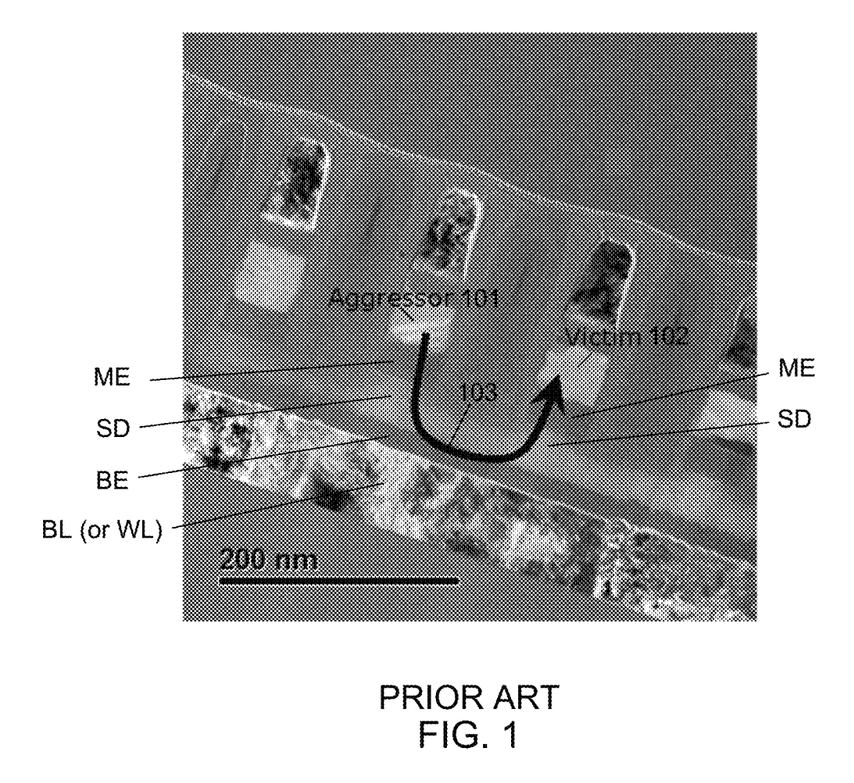
FIG. 1 depicts a lateral thermal conduction path from an aggressor cell to a victim cell for a conventional cross-point phase-change memory array.

FIG. 1 depicts a lateral thermal conduction path from an aggressor cell 101 to a victim cell 102 for a conventional cross-point phase-change memory array. When aggressor cell 101 is written (i.e., either RESET or SET), temperature in aggressor cell 101 is greater than $T_{melt}$ (for RESET) or $T_{crystallization}$ (for SET). Thermal conduction of the heat used in writing aggressor cell 101 flows laterally to victim cell 102 through a thermal conduction path 103 (through two middle electrodes (ME), two switch devices (SD), a bottom electrode (BE) layer and a bit line (BL) (or a word line (WL)) as depicted in FIG. 1. The thermally conducted heat can result in either retention loss for a victim cell in a RESET state or accelerated drift leading to higher threshold voltage $V_T$ for a victim cell.

Figure 2:
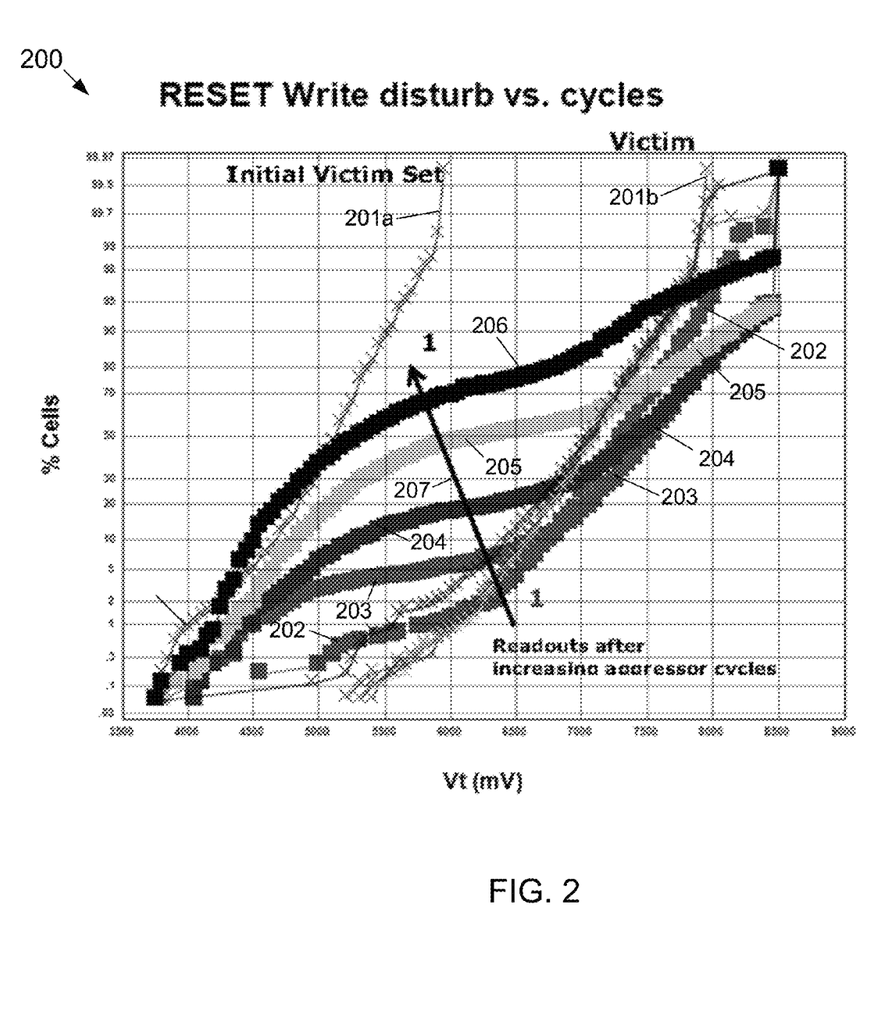
FIG. 2 is a graph showing the distribution of threshold voltage $V_t$ for victim cells for 60 nm ½-pitch in a RESET state with respect to a SET state as aggressor cells are cycled.

FIG. 2 is a graph 200 showing the distribution of threshold voltage $V_t$ for victim cells for 60 nm ½-pitch in a RESET state with respect to a SET state as aggressor cells are cycled. The abscissa of FIG. 2 is the threshold voltage $V_t$ in millivolts (mV), and the ordinate of FIG. 2 is the Percentage of (Victim) Cells. FIG. 2 shows that for an initial SET readout (curve 201*a*) and an initial RESET readout (curve 201*b*), greater than 99.9% of victim cells have about a 2000 mV threshold difference between the initial SET readout and the initial RESET readout for a single aggressor cycle. Curve 202 shows the distribution of threshold voltages $V_t$ for a RESET readout for a victim cell after ten aggressor cycles. Curve 203 indicates the distribution of threshold voltages $V_t$ for a RESET readout for a victim cell after 1000 aggressor cycles. Curve 204 indicates the distribution for threshold voltages $V_t$ for a RESET readout for a victim cell after 10,000 aggressor cycles. Curve 205 indicates the distribution of threshold voltages $V_t$ for a RESET readout for a victim cell after 100,000 aggressor cycles. Curve 206 indicates the distribution of threshold voltages $V_t$ for a RESET readout for a victim cell after one million aggressor cycles. In particular regarding curve 206, about 50% of the victim cells have the same threshold voltage $V_t$ for a SET and a RESET readout.

FIG. 2 thus shows that an increasing number of victim cells exhibit a significant retention tail of (i.e., a decreasing $V_t$ of the RESET state) that drifts toward the SET state as the number of aggressor cycles increases. Arrow 207 generally indicates the direction that the threshold voltages $V_t$ of the victim tend to drift with an increasing number of aggressor cycles. That is, the occurrence of thermal disturb (i.e., the number of bit errors) increases proportionally with the number of aggressor cycles.

Figure 3:
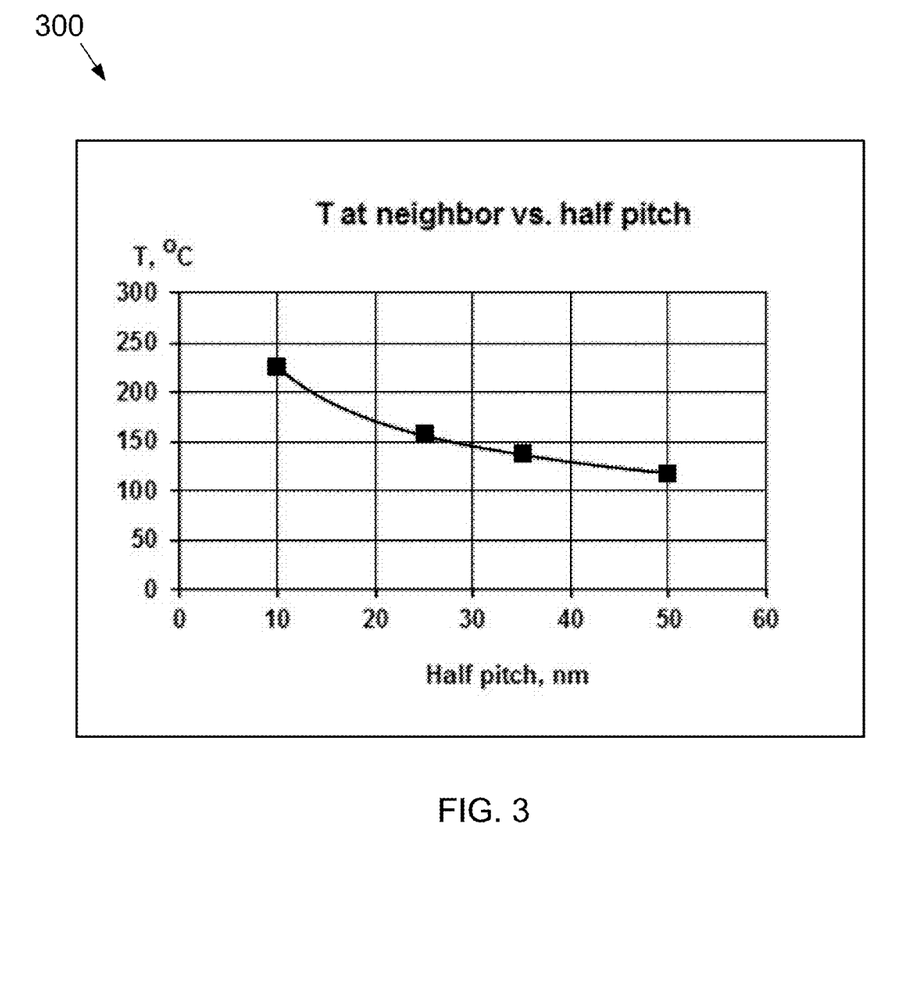
FIG. 3 shows a simulated modeling of the temperature increase of a victim cell as the ½-pitch is scaled.

FIG. 3 shows a simulated modeling 300 of the temperature increase of a victim cell as the ½-pitch is scaled. The abscissa of FIG. 3 is the half pitch in nanometers, and the ordinate is temperature T in degrees Centigrade. Thus, as the pitch of a cross-point memory is scaled smaller, the temperature of a neighbor cell rises accordingly, thereby exacerbating the retention issue for victim cells depicted in FIG. 2.

In addition to the thermal consequences associated with lateral thermal conduction depicted in FIGS. 2 and 3, for stacked cross-point memories the risk associated with a vertical thermal conduction path is greater than that associated with a lateral conduction path because the thermal isolation conventionally used between a victim cell and an aggressor cell between decks is minimal.

Figure 4:
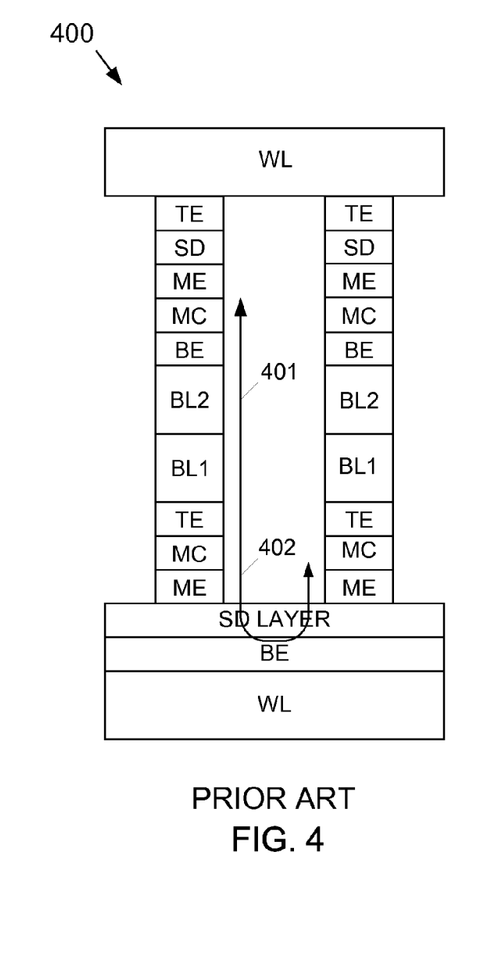
FIG. 4 depicts a cross-sectional view of a portion of an exemplary embodiment conventional 20 nm dual-deck phase-change cross-point memory.

FIG. 4 depicts a cross-sectional view of a portion of an exemplary embodiment conventional 20 nm dual-deck phase-change cross-point memory 400. The layers of cross-point memory 400 depicted in FIG. 4, starting from the bottom, comprise a word line (WL) layer, a bottom electrode (BE) layer, a switching device (SD) layer, a middle electrode (ME), a memory cell (MC), a top electrode (TE), a bit line layer for deck 1 (BL1), a bit line layer for deck 2 (BL2), a bottom electrode (BE), a memory cell (MC), a middle electrode (ME), a switching device (SD), a top electrode (TE), and a word line (WL) layer. The WL layers and the BL layers can be formed from, for example, tungsten. The electrodes can be formed from, for example, carbon. The thermal resistance of the deck-to-deck vertical thermal conduction path 401 is lower than the thermal resistance of the lateral thermal conduction path 402 because the lateral thermal conduction path 402 includes two switch devices (SDs), whereas vertical thermal conduction path 401 only includes a single switch device (SD). That is, deck-to-deck thermal isolation conventionally relies on the carbon electrodes and a switch device (SD) that provides less thermal isolation that the lateral thermal path between cells in same deck, which includes two switch devices (SDs).

Figure 5:
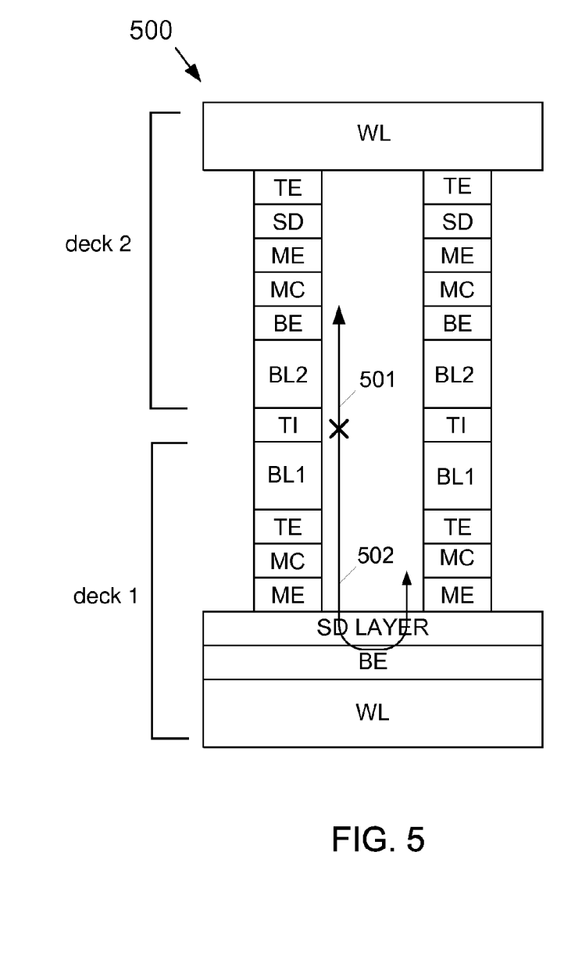
FIG. 5 depicts a cross-sectional view of a portion of an exemplary embodiment of a 20 nm dual-deck phase-change cross-point memory according to the subject matter disclosed herein.

Embodiments of the subject matter disclosed herein provide a deck-to-deck thermal isolation layer (i.e., a thermal insulating barrier) between the decks that adds only minimal processing complexity and cost, and without adversely impacting deck-to-deck operation of a dual-deck phase-change memory device. FIG. 5 depicts a cross-sectional view of a portion of an exemplary embodiment of a 20 nm dual-deck phase-change cross-point memory 500 according to the subject matter disclosed herein. Cross-point memory 500 can be, but is not limited to, part of a solid-state memory array or a solid-state drive. The layers of cross-point memory 500 depicted in FIG. 5, starting from the bottom, comprise a word line (WL) layer, a bottom electrode (BE) layer, a switching device (SD) layer, a middle electrode (ME), a memory cell (MC), a top electrode (TE), a bit line layer for deck 1 (BL1), a thermal isolation (TI) layer, a bit line layer for deck 2 (BL2), a bottom electrode (BE), a memory cell (MC), a middle electrode (ME), a switching device (SD), a top electrode (TE), and a word line (WL) layer. The WL layers and the BL layers can be formed from, for example, tungsten. The electrodes can be formed from, for example, carbon. In one exemplary embodiment, the memory cells of cross-point memory 500 are formed from a chalcogenide material, such as, but not limited to $Ge_2Sb_2Te_5$ (GST) and $In_3SbTe_2$ (IST). Dual-deck cross-point memory 500 includes a thermal isolation (TI) layer that has been formed between the BL layers of the two decks. In one exemplary embodiment, the thermal isolation layer is formed from carbon. In another exemplary embodiment, the thermal isolation layer is formed from a disordered metal alloy, such as, but not limited to, $WSe_2$. The thermal isolation material is selected so that it is electrically conducting, but comprises a higher thermal resistance than a pure metallic conductor, such as tungsten. The range of thicknesses that are suitable for the thermal isolation layer is, but is not limited to, about 5 nm to about 30 nm.

Figure 6:
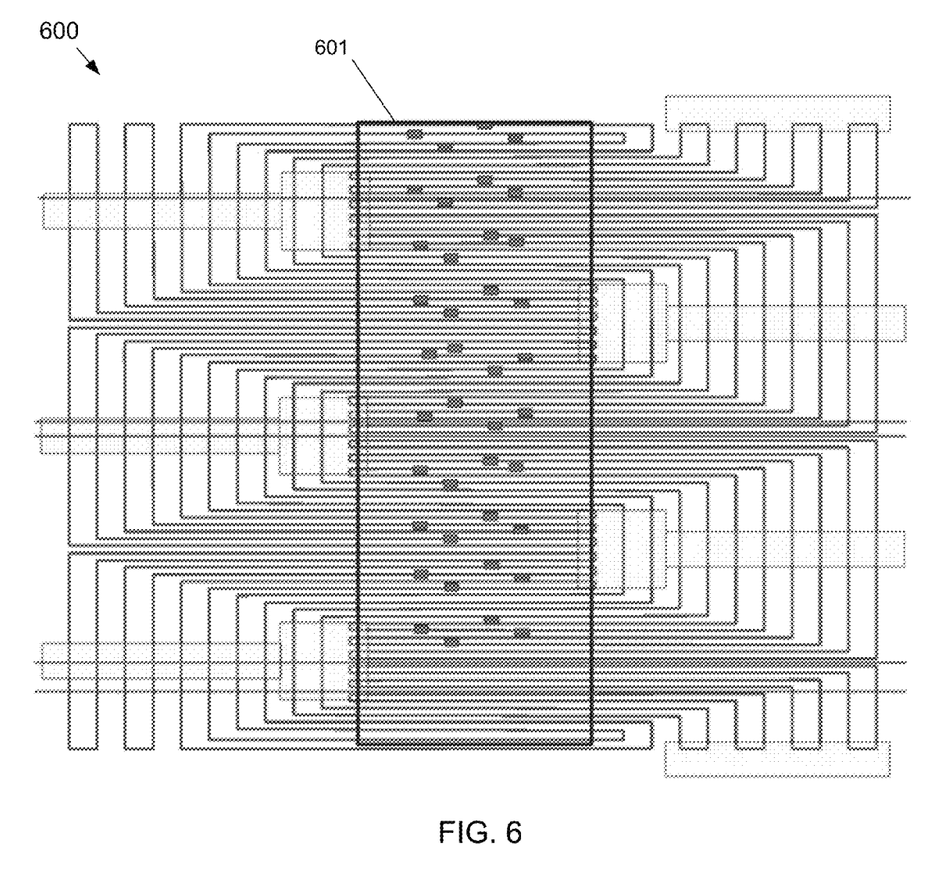
FIG. 6 depicts a top-view of the bit line (BL) layer of an exemplary embodiment of a 20 nm dual-deck phase-change cross-point memory in which an exemplary embodiment of a array-protect layer is shown that is used to preserve the thermal insulating (TI) layer that has been added between the BLs within the array according to the subject matter disclosed herein.

FIG. 6 depicts a top-view of the bit line (BL) layer of an exemplary embodiment of a 20 nm dual-deck phase-change cross-point memory 600 in which an exemplary embodiment of a array-protect layer 601 is shown that is used to preserve the thermal insulating layer (TI) (not depicted in FIG. 6) that has been added between the BLs within the array according to the subject matter disclosed herein. The additional thermal insulating (TI) layer is removed from the cross-point memory outside of the array-protect layer 601 where the two bit line (BL) layers connect to drivers, such as the socket areas located outside the array-protect layer 601, to avoid adversely impacting the electrical decoding characteristics and/or the number of drivers that are needed by the cross-point memory.

Figure 7:
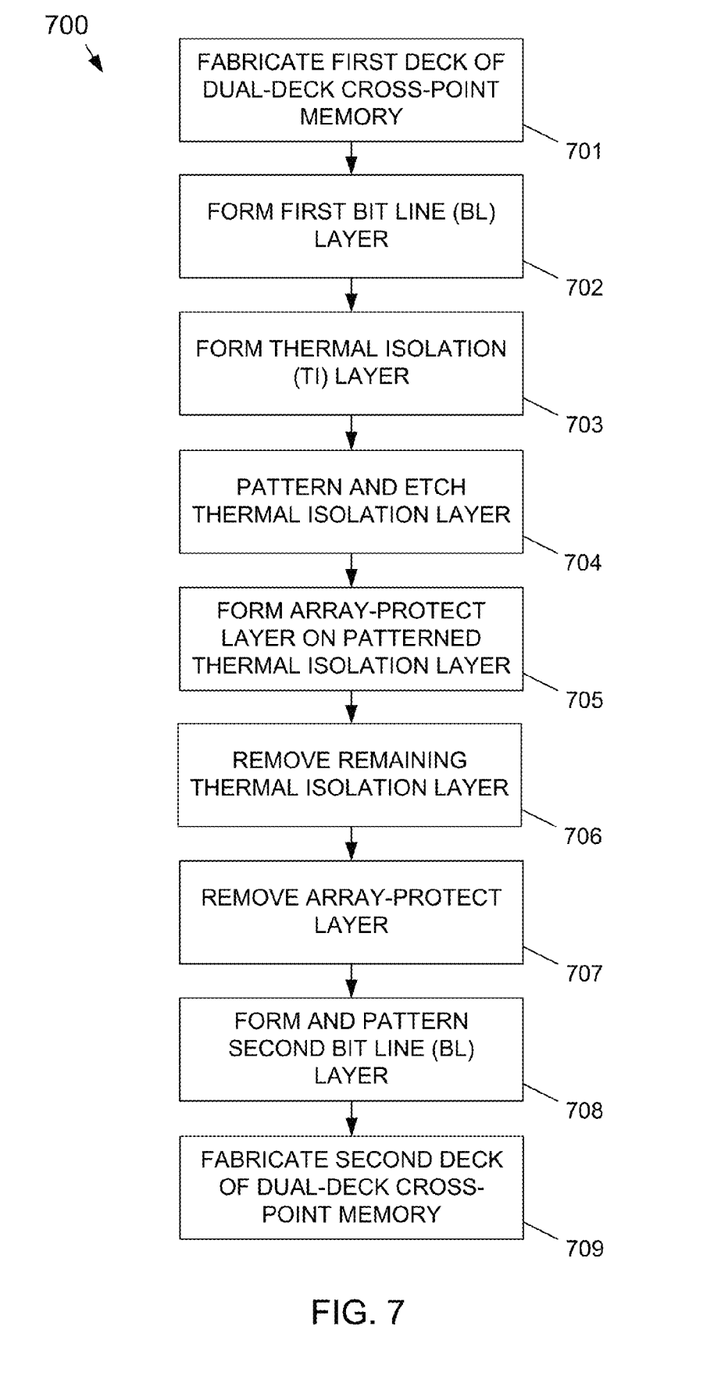
FIG. 7 depicts a flow diagram for forming a dual-deck phase-change cross-point memory according to the subject matter disclosed herein.

FIG. 7 depicts a flow diagram 700 for forming a dual-deck phase-change cross-point memory according to the subject matter disclosed herein. At 701, the first deck of a dual-deck phase-change cross point memory is fabricated using well-known techniques. At 702, a first bit line (BL) layer is formed in a well-known manner on the first deck of the cross-point memory. At 703, a thermal isolation (TI) layer is formed in a well-known manner on the first bit line (BL) layer. At 704, the thermal isolation layer is patterned and etched in a well-known manner to form areas of thermal isolation on the first bit line (BL) layer at locations where the first deck will electrically couple to the second deck of the cross-point memory. At 705, an array-protect layer is formed on the patterned and etched thermal isolation layer. At 706, the thermal isolation material remaining after operation 704 that is not protected by the array-protect layer is removed using a well-known technique so that areas where bit line (BL) layers connect to drivers, such as the socket areas, to avoid adversely impacting the electrical decoding characteristics and/or the number of drivers that are needed by the cross-point memory. At 707, the array-protect layer is removed. At 708, the second bit line (BL) layer is formed and patterned in a well-known manner. At 709, the remainder of the second deck of the dual-deck cross-point memory is fabricated using well-known techniques.

Although exemplary embodiments of dual-deck phase-change cross-point memories are disclosed herein, it should be understood that the subject matter disclosed herein is not so limited and is applicable to multi-deck phase-change cross-point memories comprising more than two decks.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A cross-point memory device, comprising:
   a first deck comprising a first array of phase-change memory cells, a first word line layer, and a first bit line layer, wherein the first array of phase-change memory cells is disposed between the first word line layer and the first bit line layer;
   a second deck comprising a second array of phase-change memory cells, a second word line layer, and a second bit line layer, wherein the second array of phase-change memory cells is disposed between the second word line layer and the second bit line layer; and
   a thermal insulation layer disposed between the first bit line layer and the second bit line layer, the thermal insulation layer being in direct contact with the first bit line layer and the second bit line layer.

2. The cross-point memory device according to claim 1, wherein the thermal insulation layer comprises carbon.

3. The cross-point memory device according to claim 1, wherein a thermal resistance of a thermal path between the first and second deck is greater than a thermal resistance of a thermal path between memory cells in the same deck.

4. The cross-point memory device according to claim 3, wherein the thermal insulation layer comprises carbon or a disordered metal alloy.

5. The cross-point memory device according to claim 1, wherein the phase-change memory cells are formed from a chalcogenide material.

6. The cross-point memory device according to claim 1, wherein the thermal insulation layer is separated from an electrode of the first deck by the first bit line layer, and is separated from an electrode of the second deck by the second bit line layer.

7. The cross-point memory device according to claim 1, wherein the cross-point memory device comprises part of part of a solid-state memory array or a solid-state drive.

8. A phase-change memory device, comprising:
   a first deck comprising a first array of phase-change memory cells, a first word line layer, and a first bit line layer, wherein the first array of phase-change memory cells is disposed between the first word line layer and the first bit line layer, the phase-change memory cells of the first array being formed from a chalcogenide material;
   a second deck comprising a second array of phase-change memory cells, a second word line layer, and a second bit line layer, wherein the second array of phase-change memory cells is disposed between the second word line layer and the second bit line layer, the phase-change memory cells of the second array being formed from a chalcogenide material; and
   a thermal insulation layer disposed between the first bit line layer and the second bit line layer, the thermal insulation layer being in direct contact with the first bit line layer and the second bit line layer.

9. The phase-change memory device according to claim 8, wherein the thermal insulation layer comprises carbon or a disordered metal alloy.

10. The phase-change memory device according to claim 8, wherein a thermal resistance of a thermal path between the first and second arrays is greater than a thermal resistance of a thermal path between memory cells in the same array.

11. The phase-change memory device according to claim 10, wherein the thermal insulation layer comprises carbon.

12. The phase-change memory device according to claim 8, wherein the thermal insulation layer is separated from an electrode of the first array by the first bit line layer, and is separated from an electrode of the second array by the second bit line layer.

13. The phase-change memory device according to claim 8, wherein the phase-change memory device comprises part of part of a solid-state memory array or a solid-state drive.

14. A method to form a cross-point memory device, the method comprising:
   forming first deck comprising a first array of phase-change memory cells, a first word line layer, and a first bit line layer, wherein the first array of phase-change memory cells is disposed between the first word line layer and the first bit line layer;
   forming a second deck comprising second array of phase-change memory cells on the first bit line layer, a second word line layer, and a second bit line layer, wherein the second array of phase-change memory cells is disposed between the second word line layer and the second bit line layer; and
   forming a thermal insulation layer disposed between the first bit line layer and the second bit line layer, the thermal insulation layer being in direct contact with the first bit line layer and the second bit line layer.

15. The method according to claim 14, further comprising patterning the first bit line layer before forming the thermal insulation layer, and
   patterning the second bit line layer before forming the second array of phase-change memory cells.

16. The method according to claim 14, wherein the thermal insulation layer comprises carbon or a disordered metal alloy.

17. The method according to claim 14, wherein a thermal resistance of a thermal path between the first and second arrays is greater than a thermal resistance of a thermal path between memory cells in the same array.

18. The method according to claim 14, wherein the phase-change memory cells are formed from a chalcogenide material.

19. The method according to claim 14, wherein the thermal insulation layer is separated from an electrode of the first array by the first bit line layer, and is separated from an electrode of the second array by the second bit line layer.

20. The method according to claim 14, wherein the cross-point memory device comprises part of part of a solid-state memory array or a solid-state drive.

21. A cross-point memory device, comprising:
a first deck comprising a first word line layer, a first bit line layer, and a first array of memory cells disposed between the first word line layer and the first bit line layer;
a second deck comprising a second word line layer, a second bit line layer, and a second array of memory cells disposed between the second word line layer and the second bit line layer; and
a thermal insulation layer disposed between the first bit line layer and the second bit line layer, the thermal insulation layer being in direct contact with the first bit line layer and the second bit line layer;
wherein the thermal insulation layer comprises tungsten diselenide.

22. The cross-point memory device according to claim 21, wherein the memory cells are formed from a chalcogenide material.

23. The cross-point memory device according to claim 21, wherein the thermal insulation layer is not an electrode.

24. The cross-point memory device according to claim 21, wherein the cross-point memory device comprises part of part of a solid-state memory array or a solid-state drive.

\* \* \* \* \*